(12) United States Patent
Penney

(10) Patent No.: US 6,920,187 B2
(45) Date of Patent: Jul. 19, 2005

(54) CONSTANT DELAY ZERO STANDBY DIFFERENTIAL LOGIC RECEIVER AND METHOD

(75) Inventor: Daniel B. Penney, Wylie, TX (US)

(73) Assignee: Micron Technology, Inc., Boise, ID (US)

( * ) Notice: Subject to any disclaimer, the term of this patent is extended or adjusted under 35 U.S.C. 154(b) by 163 days.

(21) Appl. No.: 10/264,008

(22) Filed: Oct. 2, 2002

(65) Prior Publication Data

US 2004/0066858 A1 Apr. 8, 2004

(51) Int. Cl.[7] .......................... H03K 9/00; H04L 27/06; H04L 27/14; H04L 27/22
(52) U.S. Cl. ...................... 375/316; 330/253; 327/65; 455/282
(58) Field of Search ................................. 375/316–318, 375/257; 327/51–99, 108, 170, 563; 330/253; 455/282; 326/68, 83

(56) References Cited

U.S. PATENT DOCUMENTS

| | | | | |
|---|---|---|---|---|
| 4,754,173 | A | | 6/1988 | Smith et al. ................. 307/455 |
| 5,216,298 | A | | 6/1993 | Ohba et al. .................. 307/475 |
| 5,319,259 | A | | 6/1994 | Merrill ......................... 307/443 |
| 5,369,316 | A | | 11/1994 | Chen et al. .................... 326/83 |
| 5,486,777 | A | * | 1/1996 | Nguyen ......................... 326/68 |
| 5,549,476 | A | | 8/1996 | Stern ........................... 433/223 |
| 5,654,933 | A | | 8/1997 | McLaury ............... 365/230.05 |
| 5,657,266 | A | | 8/1997 | McLaury ..................... 365/149 |
| 5,687,122 | A | | 11/1997 | Merritt ................... 365/189.05 |
| 5,768,178 | A | | 6/1998 | McLaury ..................... 365/149 |
| 5,825,207 | A | | 10/1998 | Ito ............................... 326/83 |
| 6,016,282 | A | | 1/2000 | Keeth .......................... 365/233 |
| 6,049,229 | A | * | 4/2000 | Manohar et al. ............... 326/83 |
| 6,115,318 | A | | 9/2000 | Keeth .......................... 365/233 |
| 6,351,421 | B1 | | 2/2002 | Merritt ................... 365/189.11 |
| 6,496,070 | B2 | | 12/2002 | Kubota ........................ 330/277 |
| 6,522,160 | B1 | | 2/2003 | Zivanovic .................... 324/765 |
| 6,552,596 | B2 | | 4/2003 | Cowles et al. ............... 327/318 |
| 6,650,157 | B2 | * | 11/2003 | Amick et al. ................ 327/158 |
| 6,714,051 | B2 | | 3/2004 | Takiba et al. .................. 326/86 |
| 6,784,700 | B1 | | 8/2004 | Hunt et al. ................... 327/108 |
| 2003/0139164 | A1 | * | 7/2003 | Salcido et al. .............. 455/282 |

* cited by examiner

Primary Examiner—Stephen Chin
Assistant Examiner—Curtis Odom
(74) Attorney, Agent, or Firm—Dorsey & Whitney, LLP

(57) ABSTRACT

A differential receiver circuit on an integrated circuit consumes substantially no standby power, has constant propagation delay regardless of the input common mode bias, has acceptable common mode rejection and includes first and second pass circuits and buffers to receive differential input signals. The first pass circuit provides a true output signal based on a differential between the "true" buffered signal and the complimentary buffered signal. The second pass circuit provides a "complementary" output signal based on a differential between the complimentary buffered signal and the "true" buffered signal. The differential receiver circuit rejects common mode biases that may be present on the received differential signals without varying propagation delay times.

16 Claims, 9 Drawing Sheets

PROP. DELAY
=0.54ns

PROP. DELAY
=0.59ns

PROP. DELAY
=0.59ns

PROP. DELAY
=0.56ns
&
0.59ns

CONSTANT DELAY ZERO STANDBY DIFFERENTIAL LOGIC RECEIVER AND METHOD

TECHNICAL FIELD

The present invention relates to distribution of clock and strobe signals in semiconductor integrated circuits. In particular, the invention relates to differential receivers to receive differential clock and strobe signals.

BACKGROUND OF THE INVENTION

Semiconductor integrated circuits, such as memory chips, are becoming physically larger in area, and their operational speeds are becoming faster. One challenge in such circuits is to distribute signals, such as clock and data strobe signals, over distances that are characterized as long distances, at least long as compared to the time periods available for rise times, fall times, pulse widths, etc. With such circuits, it is becoming increasingly more important to maintain correct duty cycle on certain critical signals, such as clock and strobe signals, especially at high frequencies. However, when a single pulse is propagated through many driver receiver pairs, the duty cycle (e.g., as measured by the positive or negative pulse width) may change owing in part to differences in the characteristics of, for example, the p channel and n channel transistors that make up the drivers and receivers.

One such strobe signal is a DQS ("data strobe") signal, and the timing of the DQS signal is especially important for double data rate (DDR) DRAMs in which both the rising and falling edges of the DQS signal are used to strobe data in and out of the DRAMs. Increases or decreases in duty cycle of the strobe, for any reason, will result in data clocked in early or late. At high frequencies, data that is clocked in early, may not be accurate since the voltages on the data lines many not have had time to settle to a level that is representative of the data value.

To facilitate signals driven into heavy and multiple loads, a design may employ intermediate drivers between the signal source and the ultimate loads in a "fan out" arrangement. Intermediate drivers tend to introduce duty cycle skew as well. For example, a 3 nanosecond pulse width might become more narrow than or wider than the original 3 nanoseconds when the pulse propagates through the intermediate driver. This may be due to the threshold (or trip point) at which the intermediate driver recognizes that a received signal has switched to another state (i.e., from "1" to "0" or from "0" to "1"). This may also be due to differences in the drive of the p channel and n channel transistors that constitute the intermediate driver (also called P-N drive imbalance). These effects cause a "1" to propagate differently than a "0".

Use of differential signal intermediate drivers can eliminate these types of duty cycle errors, but a differential receiver is required at the destination. A differential input signal, which is actually a signal and its compliment, is applied to the input of the differential receiver. A cross point of the two signals that constitute input differential signal is defined to be the voltage at which the signals cross and have the exact same voltage at the exact same time. However, the cross point may not necessarily be midway between the signal high and signal low voltage. Instead, the cross-point of the input differential signal may be high or low relative to the design sensing threshold of the differential receiver. The high or low cross point may be caused by semiconductor process variations, P-N drive differences, temperature, $V_{CC}$, common mode noise coupling equally into the differential signal, etc. The function of the differential receiver is to convert an input differential signal (in which the cross point may be high or low) into a centered output signal, either a differential output signal or a single ended output signal. The output signal of the differential driver, which must finally be used as a single ended signal for CMOS logic functions, has consistent timing for the final application. Duty cycle errors can be eliminated at the receiver since one signal goes high and the other signal goes low for both logic states and the cross point for each state contains the original duty cycle information.

Differential receivers have an additional advantage. Common mode bias that couples into the differential signal from stray signals or from supply noise can cause timing error (undesired delays) in single ended drivers. However, differential receivers eliminate these timing errors. Any coupling or supply noise that is common to both differential signals can be eliminated by the differential receiver. However, a problem remains with the use of known differential receivers. Known differential receivers are based on differential transistor pairs requiring a constant current source to propagate through either transistor of the differential pair. Thus, differential receivers consume a significant current whether or not differential signals are actually needed to be processed through the receiver at the particular time. In many applications it would be impractical to use as many differential pair receivers in critical clock paths as might otherwise be desired since a high standby current would be consumed.

Another problem is that this type of differential receiver has a different propagation delay depending on the voltage of the cross point of the differential input signals (as when a common mode voltage bias is coupled into the differential input signals). A varying propagation delay is unacceptable for critical timing paths, especially at high frequencies.

There is therefore the need for a differential receiver that can generate a differential output signal from a differential input signal while preserving the timing characteristics of the differential input signal.

SUMMARY OF THE INVENTION

An integrated circuit in accordance with the invention includes a differential receiver circuit that consumes substantially no standby power, has constant propagation delay regardless of the input common mode bias, has acceptable common mode rejection and includes first and second pass circuits and buffers to receive differential input signals. The first pass circuit provides a "true" output signal when there is a difference between a "true" buffered signal and a "complimentary" buffered signal. The second pass circuit provides a "complementary" output signal when there is a difference between the "complimentary" buffered signal and the "true" buffered signal. The differential receiver circuit further includes cross coupled inverters latching the true and complimentary output signals in complementary states, and final drive buffers for amplifying the true and complimentary output signals.

BRIEF DESCRIPTION OF THE DRAWINGS

The invention will be described in detail in the following description of preferred embodiments with reference to the following figures wherein.

DETAILED DESCRIPTION OF THE INVENTION

Figure 1:
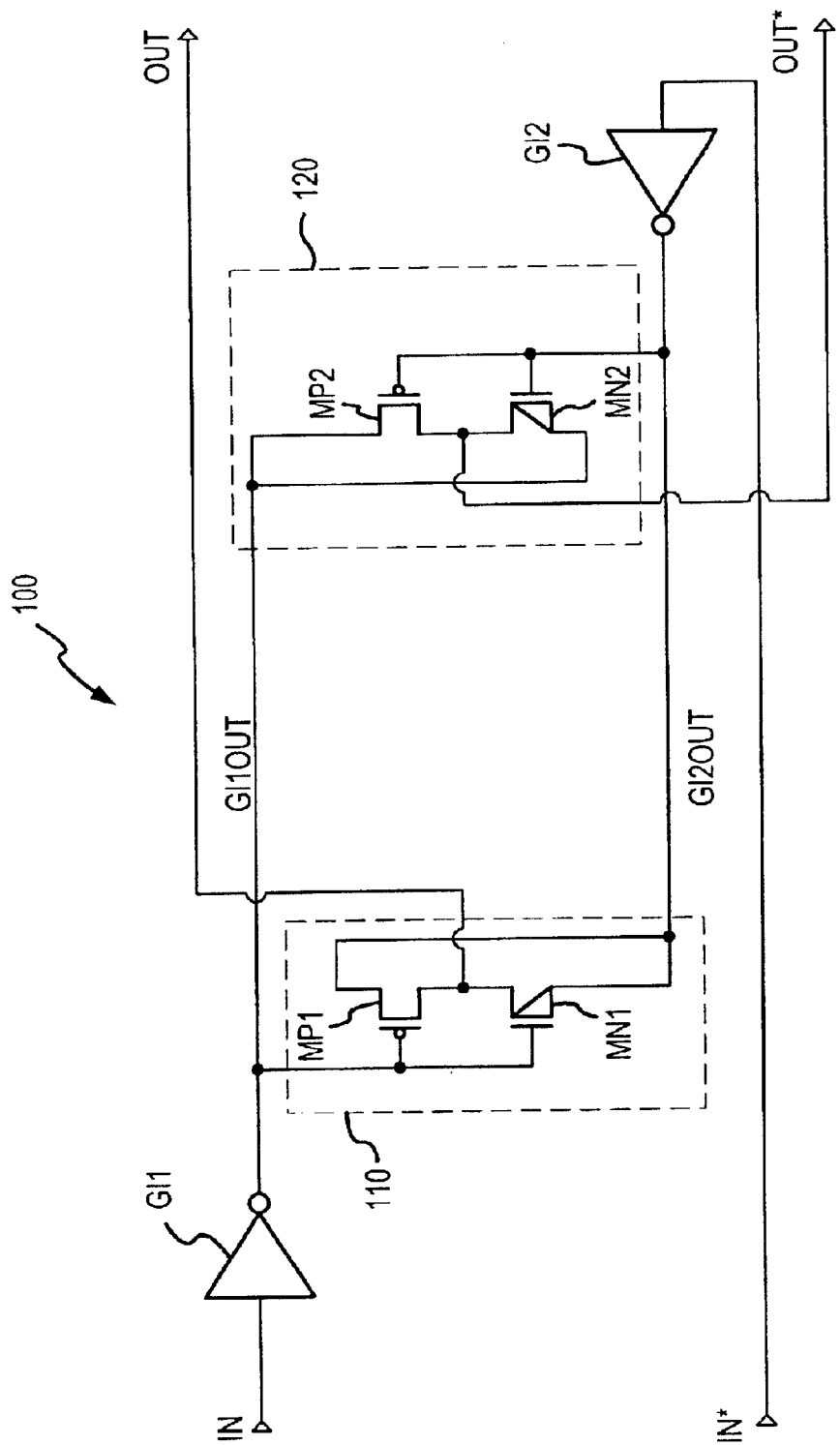
FIG. 1 is a schematic diagram of a receiver according to an example of the basic invention.

A common mode receiver 100 according to one example of the present invention is depicted in FIG. 1. The receiver 100 includes a first inverter GI1 coupled to a true input signal IN to produce an inverted signal GI1OUT, and also includes a second inverter GI2 coupled to a complimentary input signal IN* to produce a complimentary signal GI2OUT. The receiver 100 also includes a first pass circuit 110 to provide a true output signal OUT. When differential output signals are desired, as with intermediate drivers, the receiver 100 also includes a second pass circuit 120 to provide a complimentary output signal OUT*.

The first pass circuit 110 includes a p channel transistor MP1 and an n channel transistor MN1. Gates of both the transistors MP1 and MN1 are coupled to the output of the first inverter GI1 so that the signal GI1OUT is applied to the gates of the transistors MP1 and MN1. The signal GI1OUT controls the conductive state of the transistors MP1, MN1 and thus constitutes a control input of the first pass circuit 110. The sources of both the transistors MP1 and MN1 are coupled to receive the signal GI2OUT from the output of the second inverter GI2. The GI2OUT signal is coupled through one of the transistors MP1 and MN1 to the drains of the transistors MN1 and MP1 depending upon the state of the GI1OUT signal. More specifically, the GI2OUT signal is coupled through the transistors MP1 when the GI1OUT signal is low (i.e., IN is high), and is coupled through the transistors MN1 when the GI1OUT signal is high (i.e., IN is low). The drains of the transistors MP1 and MN1 are coupled to the output signal OUT and thus constitute the output of the first pass circuit 110 and the true output of the receiver 100.

Although the signal GI2OUT is passed to the output signal OUT through either of the transistors MP1 or MN1, but not both, it is not passed through the transistor MP1 until the signal GI1OUT becomes sufficiently low to turn on the transistor MP1, and the signal GI2OUT is not passed through the transistor MN1 until the signal GI1OUT becomes sufficiently high to turn on the transistor MN1. This gives the receiver 100 a desired differential effect. The differential effect derives from the fact that the transistors MP1, MN1 conduct only when the signal GI1OUT is of a different polarity than the polarity of the signal GI2OUT. The pass circuit 120 operates similarly to the pass circuit 110 to couple the signal GI1OUT through a p channel transistor MP2 to the complimentary output signal OUT* when GI2OUT is low (i.e., IN* is high), and through an n channel transistor MN2 to the complimentary output signal OUT* when GI2OUT is high (i.e., IN* is low). Again, the signal GI1OUT is not passed through the transistor MP2 until the signal GI2OUT becomes sufficiently low to turn on the transistor MP2, and the signal GI1OUT is not passed through the transistor MN2 until the signal GI2OUT becomes sufficiently high to turn on the transistor MN2. This gives the receiver 100 the desired differential effect as well as differential output signals. The differential effect derives from the fact that the transistors MP1, MN1 conduct only when the signal GI1OUT is of a different polarity than the polarity of the signal GI2OUT.

Persons of ordinary skill in the art will appreciate in light of these teachings that the first and second inverters GI1 and GI2 may advantageously be non inverting buffers. In such a configuration, signals from the buffers should be cross connected to replace the signals GI1OUT, GI2OUT in order to maintain the correct signal polarity into the pass circuits 110, 120. Furthermore, the pass circuit 120 can be omitted if a differential output signal is not desired.

The receiver 100 does not include any constant current source as may be found in a conventional differential receiver. Accordingly, the receiver 100 consumes substantially no steady state power, although it does consume transient switching power. Furthermore, the differential effect discussed above provides the receiver 100 with the ability to reject common mode bias and noise in much the same way that a conventional differential receiver is able to reject common mode bias and noise. However, unlike a conventional differential receiver, the receiver 100 affects a substantially constant time delay of the input signals that is independent of the common mode bias or noise due in part to the differential effect discussed above and due in part to the fact that the signal passing through the pass circuit, either the pass circuit 110 or 120 or both, is eventually compared to a fixed digital threshold midway between the signal maximum and minimum. The propagation delays through conventional differential receivers are known to be dependent on the common mode bias or noise.

Figure 2:
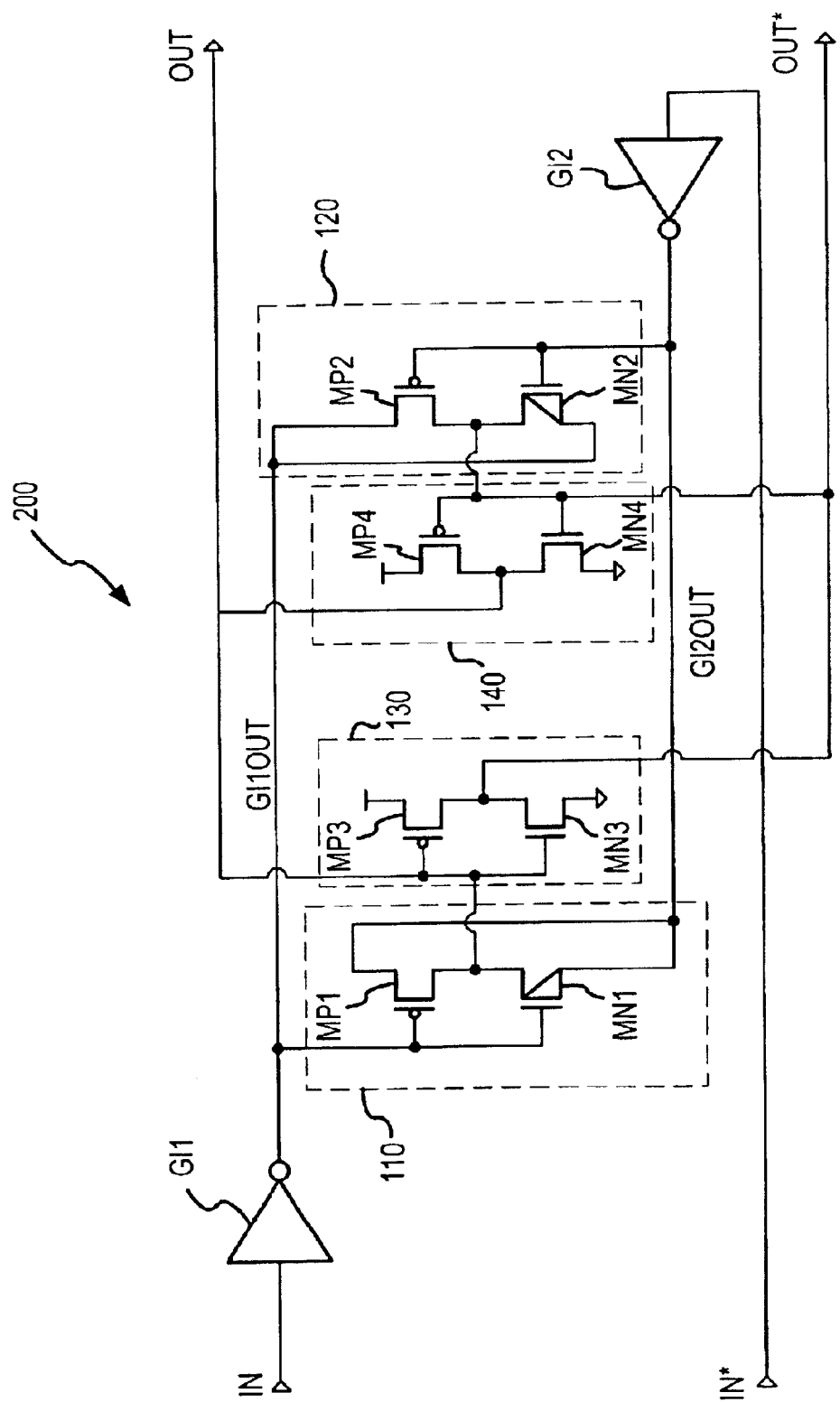
FIG. 2 is a schematic diagram of the receiver of FIG. 1 and having a latch according to another example of the invention.

Another embodiment of a receiver 200 according to the present invention is depicted in FIG. 2. The receiver 200 includes all of the same components that are present in the receiver 100 of FIG. 1. In the interest of brevity, these components have been provided with the same reference characters, and an explanation of their operation will not be repeated. The receiver 200 differs from the receiver 100 by including a third inverter 130 and a fourth inverter 140. The inverters 130, 140 include respective p channel transistors MP3, MP4 and respective n channel transistors MN3, MN4 coupled together in a known inverter configuration. An input of the third inverter 130 is coupled to the true output signal OUT, and an output of the third inverter 130 is coupled to the complimentary output signal OUT*. An input of the fourth inverter 140 is coupled to the complimentary output signal OUT*, and an output of the fourth inverter 140 is coupled to the true output signal OUT. Thus, the inverters 130, 140 are cross coupled, and they provide a latching function.

The transistors in the first and second inverters GI1, GI2 and in the first and second pass circuits 110, 120 are designed to over drive the transistors in the third and fourth inverters 130, 140. Since the third and fourth inverters 130, 140 are cross coupled to form a latch having two stable states, the first and second inverters GI1, GI2 and the first and second pass circuits 110, 120 are sized to provide drive currents sufficient to cause the latch to change states if required. The drive capacity of a transistor may be characterized by the channel width to length ratio. An example of length to width ratios for the several components of the invention examples discussed herein is provided below as guidance for designing receivers according to the invention. However, it is to be understood that the drive of the several components are only representative of the invention examples, and modification may be made in light of these teachings In the example used in the simulations discussed below, each of the p channel transistors MP1, MP2 and each of the n channel transistors MNI1, MN2 has a width to length ratio of 15. Each of the first and second inverters GI1, GI2 includes a p channel transistor and an n channel transistor. Each of the p channel transistors of the first and second inverters GI1, GI2 has a width to length ratio of 50, and each of the n channel transistors of the first and second inverters GI1, GI2 has a width to length ratio of 20. These preferred width to length ratios are a function of the specific semiconductor processes and design properties of the transistors involved. With this example, each of the p channel transistors MP3, MP4 has a width to length ratio of 8, and each of the n channel transistors MN3, MN4 has a width to length ratio of 6. Alternatively, the p channel transistors MP3, MP4 might have a width to length ratio of 6, and the n channel transistors MN3, MN4 might each have a width to length ratio of 4. With these parameters, the third and fourth inverters GI3, GI4 can be over powered by the drive capacity of the first and second inverters GI1, GI2 and the first and second pass circuits 110, 120. The third and fourth inverters GI3, GI4 provide the sharply latched critical load voltages that are to be further buffered as discussed below.

Figure 3:
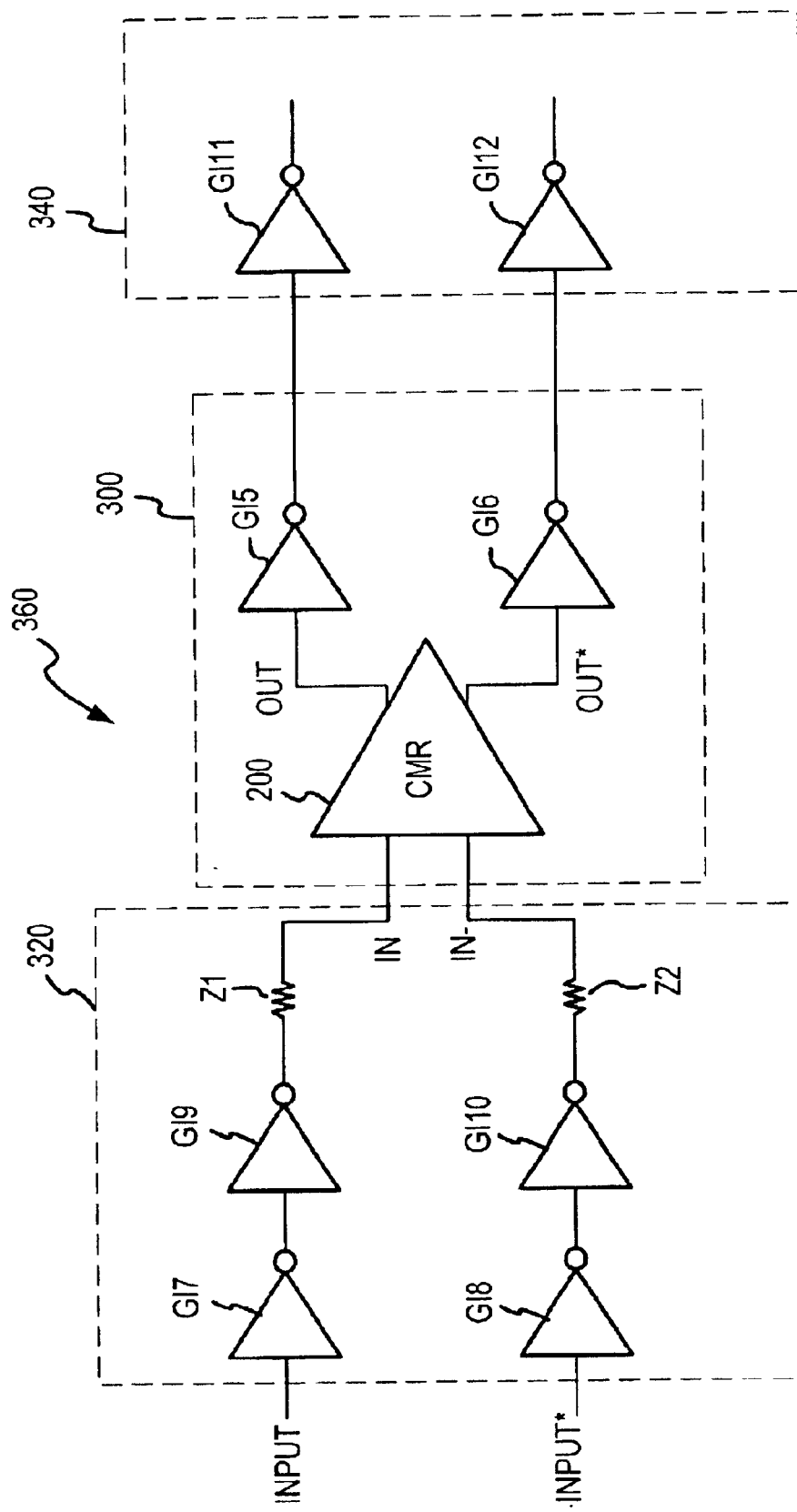
FIG. 3 is a schematic diagram of the receiver of FIG. 2 and having final drivers according to another example of the invention.

Another embodiment of a complete differential receiver 300 according to the invention is shown in FIG. 3. The receiver 300 includes the receiver 200 and a final pair of buffers GI5, GI6 coupled to receive the OUT and OUT* signals, respectively, to improve the drive capacity of the receiver 200. The buffers GI5, GI6 are preferably located close to the receiver 200 so that there is little or no waveform distortion (e.g., as might be caused by a RC structure in a long transmission line). Each of the final pair of buffers GI5, GI6 includes a p channel transistor and an n channel transistor. Each of the p channel transistors of the final pair of buffers GI5, GI6 preferably has a width to length ratio of 60, and each of the n channel transistors of the final pair of buffers GI5, GI6 preferably has a width to length ratio of 30.

Another embodiment of an integrated circuit 360 on a semiconductor chip according to the invention is shown in FIG. 3. The integrated circuit 360 includes the receiver 300 plus a drive chain 320 to amplify low level signals, parasitics Z1, Z2 made of a differential signal transmission line and a load 340. The drive chain 320 includes seventh and eighth inverters GI7 and GI8 and includes ninth and tenth inverters GI9 and GI10. True and complimentary input signals INPUT and INPUT* are provided to inputs of respective seventh and eighth inverters GI7 and GI8. The outputs of seventh and eighth inverters GI7 and GI8 are coupled to respective inputs of ninth and tenth inverters GI9 and GI10. Each of the inverters GI7, GI8, GI9 and GI10 includes one p channel and one n channel transistor, and the inverters GI7, GI8, GI9 and GI10 all together constitute a drive chain 320 to amplify the true and complimentary input signals INPUT and INPUT*. The amplified true and complimentary input signals at the outputs of the inverters GI9 and GI10 are applied to drive a differential transmission line represented by Z1 and Z2, and Z1 and Z2 are often referred to as parasitics Z1 and Z2. The parasitic Z1 and parasitic Z2 are complexes of distributed resistances and capacitances that depend on the specific design being considered as described below.

As discussed above, the width to length ratios as discussed herein, and the properties of the parasitics Z1 and Z2, relate only to limited invention examples that are used in the simulation discussed below, but that modifications in light of these teaching are within the spirit and scope of the invention. In keeping with the scale of the width to length ratios discussed above, each of the p channel transistors of the seventh and eighth inverters GI7, GI8 preferably has a width to length ratio of 80, and each of the n channel transistors of the seventh and eighth inverters GI7, GI8 preferably has a width to length ratio of 40. Each of the p channel transistors of the ninth and tenth inverters GI9, GI10 preferably has a width to length ratio of 250, and each of the n channel transistors of the ninth and tenth inverters GI9, GI10 preferably has a width to length ratio of 125. The drive chain 320 provides adequate drive capacity to launch a differential signal on parasitics Z1 and Z2 and from there to loads 340 beyond (e.g., one or more complete differential receivers 300). Although, the parasitic Z1 and parasitic Z2 are complexes of distributed resistances and capacitances, in aggregate, the distributed resistance of each parasitic is fairly represented by a series resistance of about 629 ohms, and the distributed capacitance of each parasitic is fairly represented by a shunt capacitance (to ground) of about 0.8926 pico Farads; however, the specific parameters depend on the specific design being considered. Each parasitic functions as a low pass filter.

In the integrated circuit 360, differential outputs of the complete differential receiver 300 are applied to the loads 340 represented by eleventh and twelfth inverter loads GI11 and GI12. Each of the eleventh and twelfth inverter loads GI11 and GI12 actually includes 5 individual inverters in a fan out arrangement, and each of these 10 inverters includes a p channel and an n channel transistor in a known inverter arrangement. These 10 inverters represent the load (e.g., the inputs of several CMOS circuits) applied to the output from the complete differential receiver 300, but the particular arrangement of this load may vary from one integrated circuit design to another. In keeping with the scale of the width to length ratios discussed above, each of the p channel transistors of the 10 inverters in the eleventh and twelfth inverter loads GI11, GI12 preferably has a width to length ratio of 40, and each of the n channel transistors of the 10 inverters in the eleventh and twelfth inverter loads GI11, GI12 preferably has a width to length ratio of 20.

Figure 4:
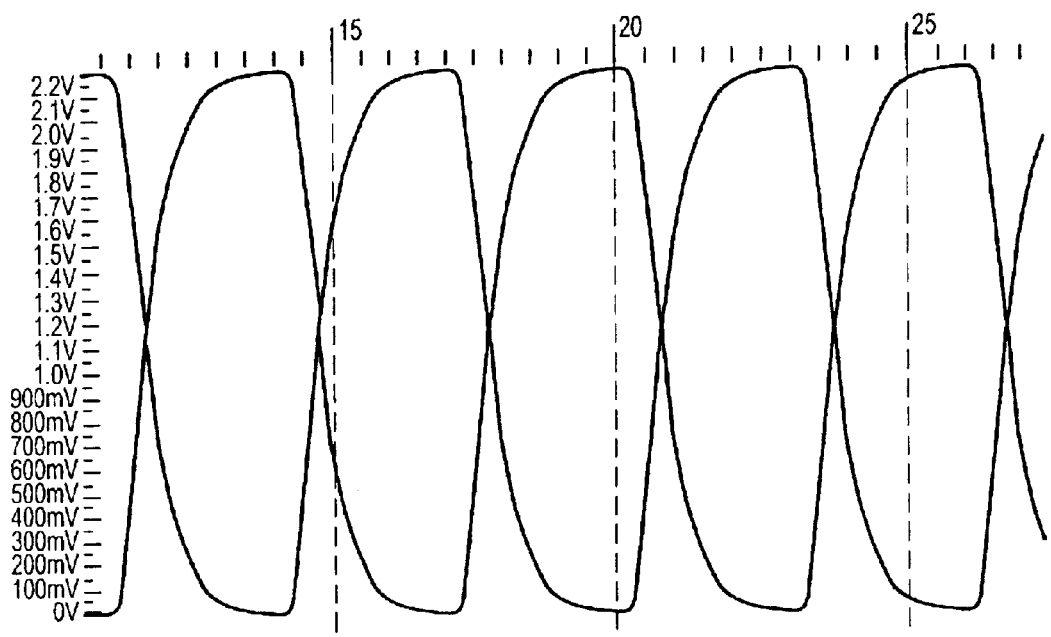
FIG. 4 is a graph of a balanced differential input signal into the receiver of FIG. 3.

FIG. 4 is a plot of a simulation result of the input signals into the complete differential receiver 300 after an ideal square wave, with a 6 nanosecond full cycle, was input as the true and complimentary input signals INPUT and INPUT* (see FIG. 3) and propagated through the drive chain 320 and through the parasitic Z1 and parasitic Z2 onto the load that is the inputs to the complete differential receiver 300. The waveform becomes distorted but the cross points remain roughly centered at about 1.1 volts (i.e., midway between zero volts and 2.2 volts, the full waveform magnitude). In this balanced case, the differential receiver is not actually needed. At the CMOS threshold (e.g., 1.1 volts in this case) for distinguishing between two logic levels, the duty cycle of either side of the differential signal is a balanced 50%. The drive chain 320 could be designed to be single ended, and the signal out of the parasitic Z1 could be applied directly into the load 340 since any CMOS circuits that constitute the load would input a signal with a balance 50% duty cycle. This result may be obtained when the p channel and n channel transistors in the drive chain 320 are balanced, and when the parasitics Z1, Z2 are balanced. In this case a single ended signal could be used with no loss of duty cycle.

Figure 5:
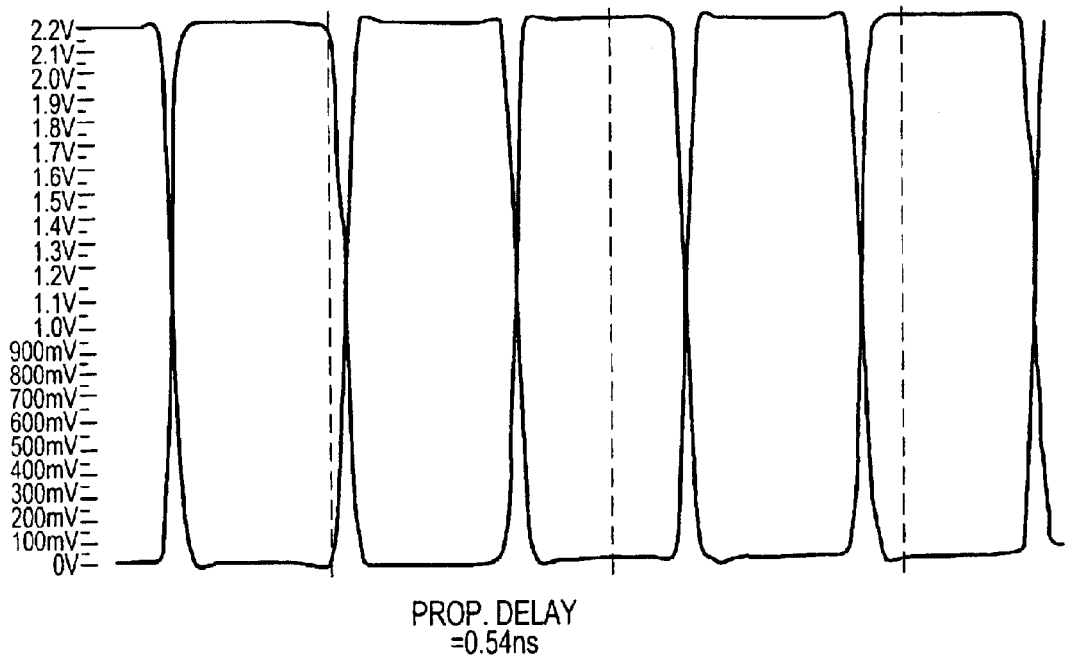
FIG. 5 is a graph of a simulated result of a differential output signal from the complete differential receiver depicted in FIG. 3 when stimulated with the input waveform depicted in FIG. 4.

FIG. 5 is a plot of a simulation result of the output signals from the complete differential receiver 300 into the eleventh and twelfth inverter loads GI11 and GI12 when the signals depicted in FIG. 4 are provided at the inputs into the complete differential receiver 300. This simulation result confirms that the complete differential receiver 300 preserves the centered cross points with a fixed propagation delay of 0.54 nanoseconds from an input cross point to an output cross point for each transition type (up and down).

Figure 6:
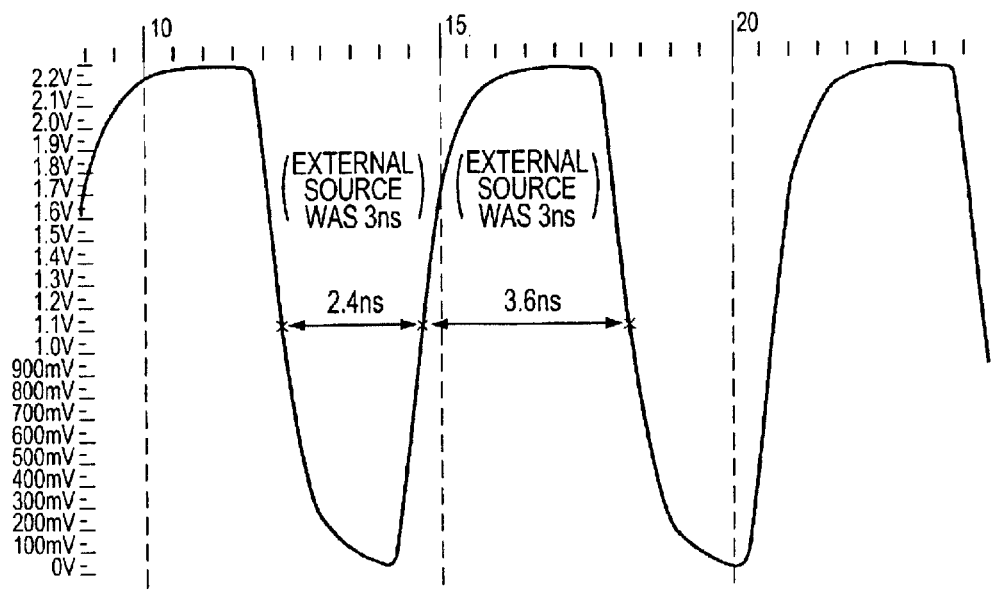
FIG. 6 is a graph of a single ended input signal that is skewed.

FIG. 6 is a plot of a simulation result of a single ended waveform with skewed duty cycle at the midpoint (e.g., about 1.1 volts). A skewed duty cycle means that at the midpoint, about 1.1 volts, the positive pulse width is different than the negative pulse width. In FIG. 6, the positive pulse width is about 3.6 nanoseconds wide and the negative pulse width is only about 2.4 nanoseconds wide. In this simulation, the input signal into the drive chain 320 was an ideal square wave with a 6 nanosecond full cycle. Such a skewed duty cycle might be the result of possibly accumulated mismatch of p channel and n channel transistors in the drive chain 320. The uses of single ended signals with such skewed duty cycles are limited when both the rising and falling edges are to be used to transfer data.

Figure 7:
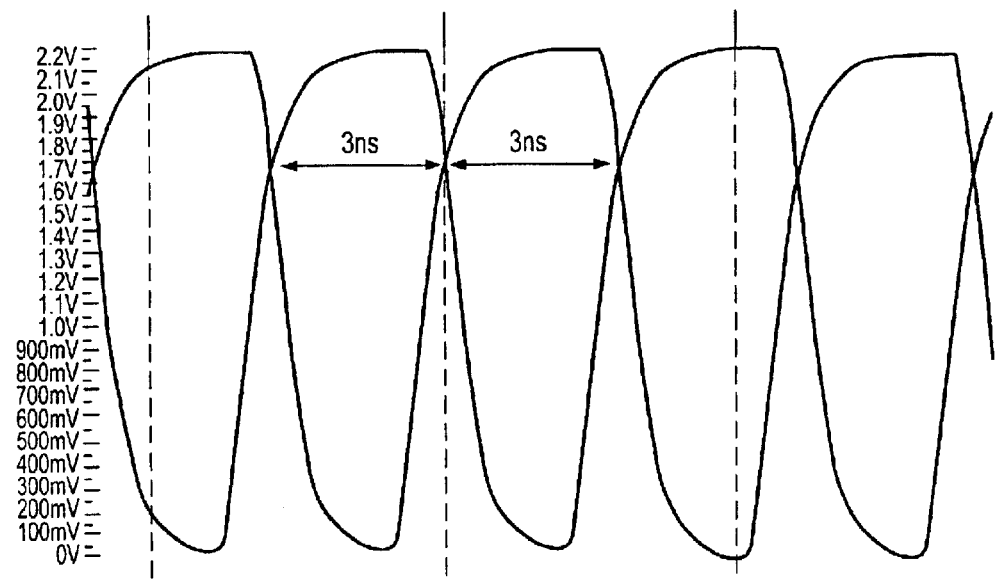
FIG. 7 is a graph of a differential input signal where each signal of the differential input signal is skewed resulting in a high cross point.

FIG. 7 is a plot of a simulation result of a complimentary single ended waveform with skewed duty cycle at the midpoint (e.g., about 1.1 volts) overlaid on the plot of FIG. 6 to constitute a differential waveform. Both overlaid waveforms are skewed, and the cross points appear above the 1.1 volt midpoint at about 1.7 volts. Duty cycle is measured from cross point to cross point, and the overlaid waveforms of FIG. 7 have equal duty cycles (about 3 nanoseconds) but at a high cross point. The use of a differential signal path preserves the original (i.e., externally applied) 50% duty cycle information but in the form of high cross points. In this case the cross points are above the 1.1 volts midpoint or CMOS detecting threshold, and are at 1.7 volts. To be useful, the 50% duty cycle information must be extracted to be used as a single ended waveform for CMOS logic functions where the 50% duty cycle exists at the midpoint or CMOS detecting threshold. The receiver 100, 200 or 300 advantageously extracts the 50% duty cycle information with a threshold at the midpoint between signal magnitude extremes.

Figure 8:
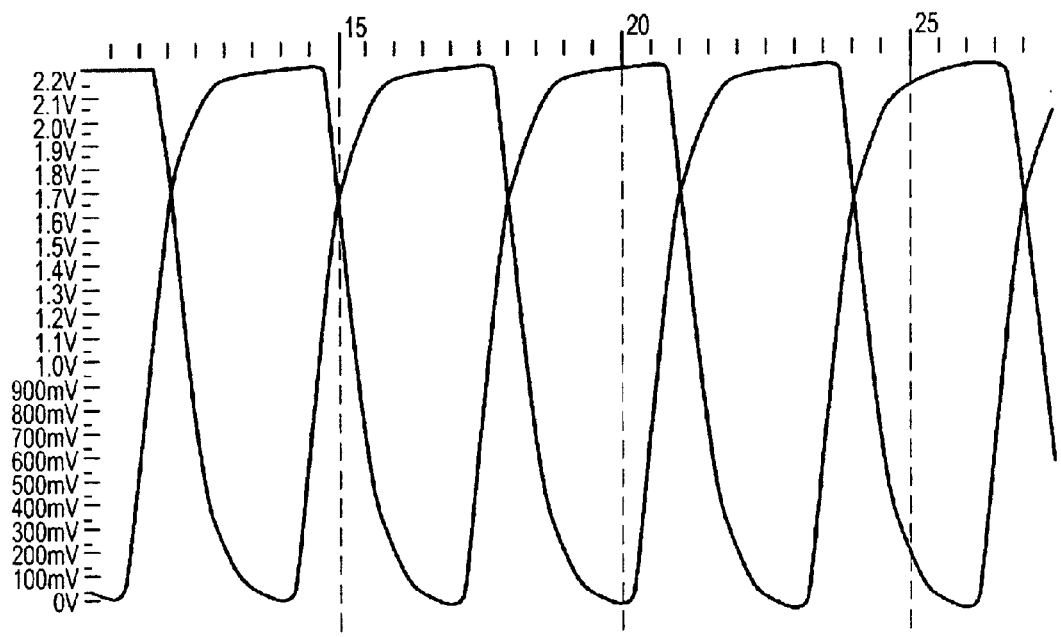
FIG. 8 is a graph of a differential input signal with high cross points into the receiver of FIG. 3 that is identical to the graph in FIG. 7 but is aligned with the graph in FIG. 9.
Figure 9:
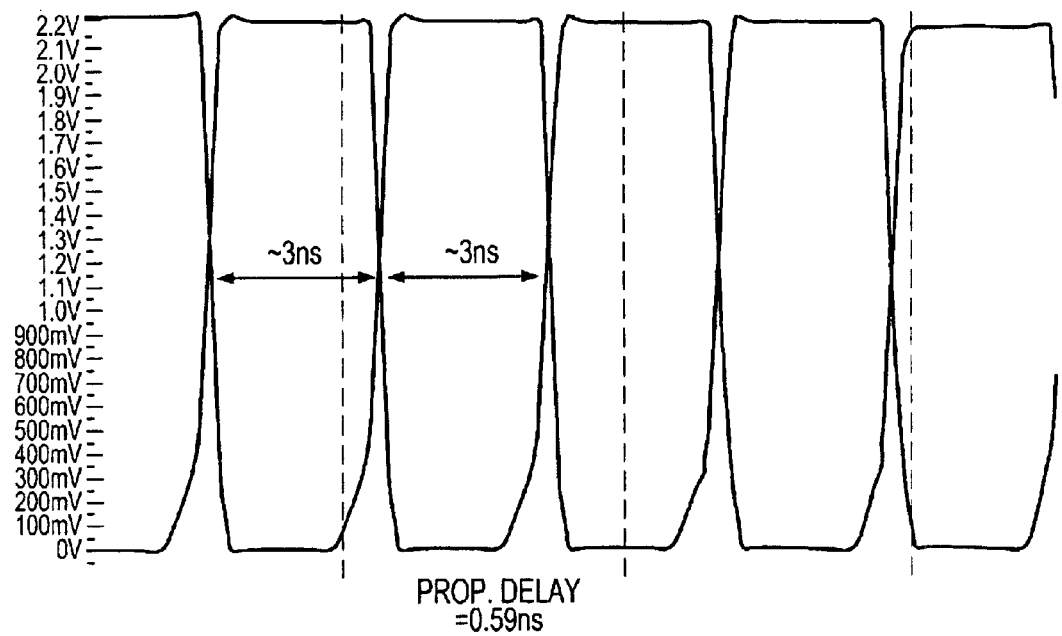
FIG. 9 is a graph of a simulated result of a differential output signal from the complete differential receiver depicted in FIG. 3 when stimulated with the high cross point input waveform depicted in FIG. 8.

FIG. 8 depicts the same high cross point waveform as inputs to the complete differential receiver 300 but arranged in relation to FIG. 9. FIG. 9 is a plot of a simulation result of the output signals from the complete differential receiver 300 into the eleventh and twelfth inverter loads GI11 and GI12 when the differential signals depicted in FIG. 8 are provided at the inputs into the complete differential receiver 300. After passing through the complete differential receiver 300 with a delay of about 0.59 nanoseconds from the input cross point to the output cross point, the high cross point differential signal is restored closer to the center (i.e., 1.1 volts) with about the same fixed propagation delay as the delay that was associated with a centered cross point as discussed above with respect to FIG. 4 and FIG. 5. Either of the differential outputs from the complete differential receiver 300 may then be used as a single ended signal since most of the original duty cycle has been restored to both.

Figure 10:
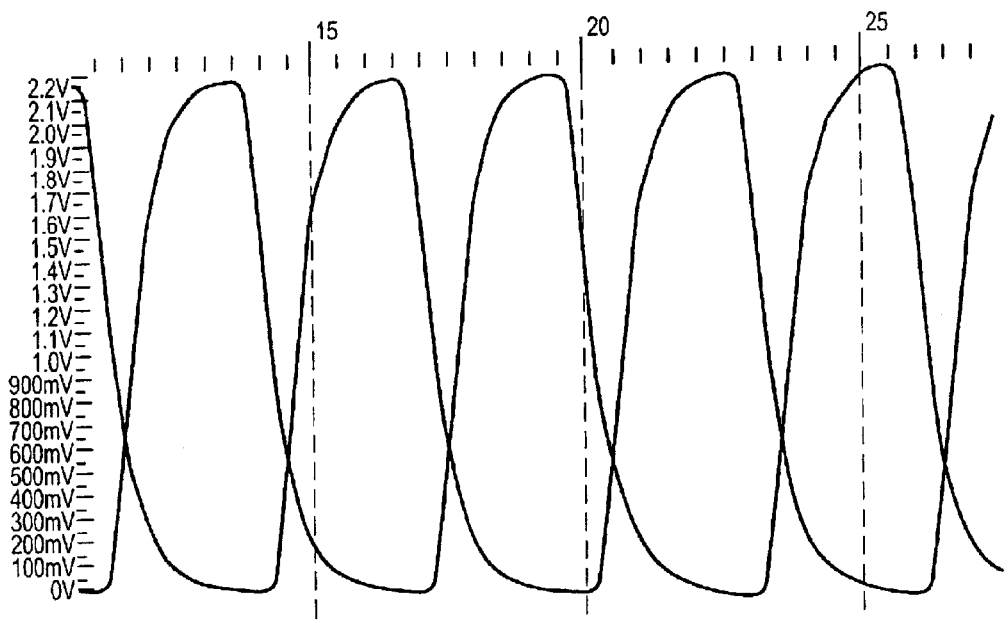
FIG. 10 is a graph of a differential input signal with low cross points into the receiver of FIG. 3.
Figure 11:
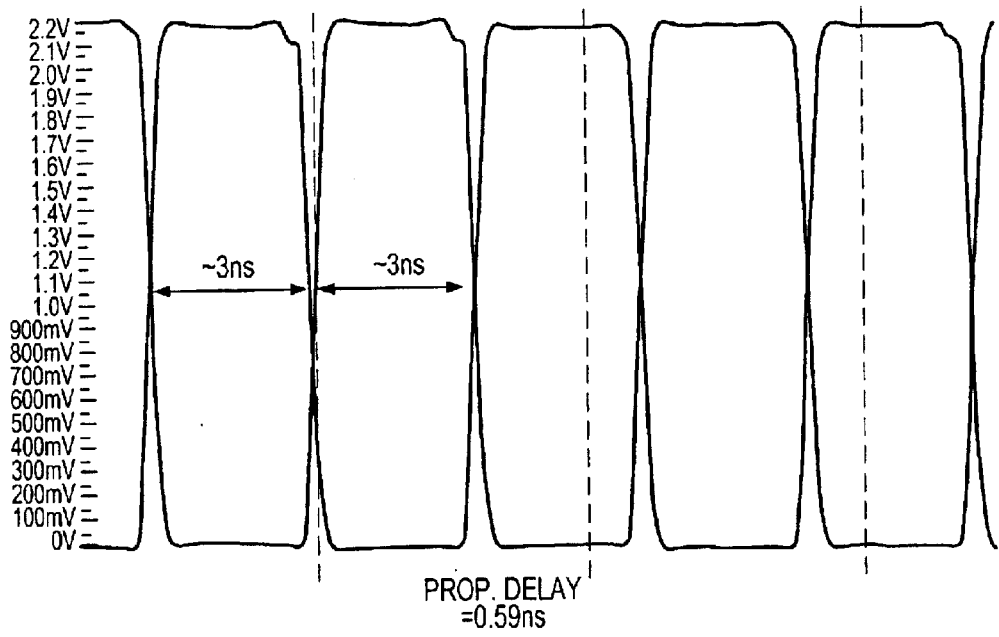
FIG. 11 is a graph of a simulated result of a differential output signal from the complete differential receiver depicted in FIG. 3 when stimulated with the low cross point input waveform depicted in FIG. 10.

FIG. 10 depicts a low cross point waveform that is the inverse of the high cross point waveform depicted in FIG. 8. FIG. 11 is a plot of a simulation result of the output signals from the complete differential receiver 300 into the eleventh and twelfth inverter loads GI11 and GI12 when the differential signals depicted in FIG. 10 are provided at the inputs into the complete differential receiver 300. As with the high cross point case, the low cross point waveform passes through the complete differential receiver 300 with a delay of about 0.59 nanoseconds from the input cross point to the output cross point. As with the high cross point case, the low cross point differential signal is restored closer to the center. Either of the differential outputs from the complete differential receiver 300 may then be used as a single ended signal since most of the original duty cycle has been restored to both.

Figure 12:
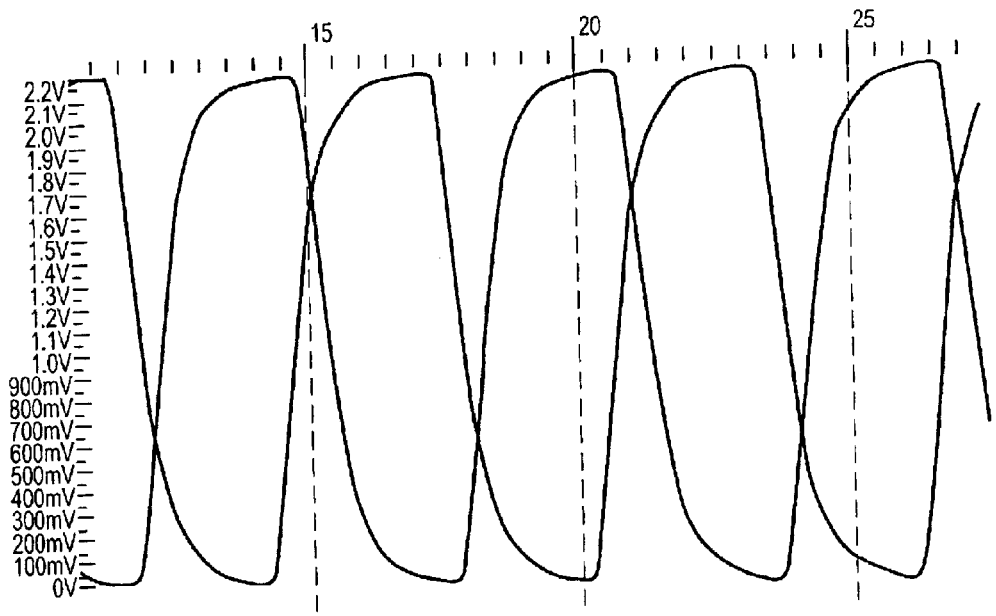
FIG. 12 is a graph of a differential input signal with mixed low and high cross points into the receiver of FIG. 3.
Figure 13:
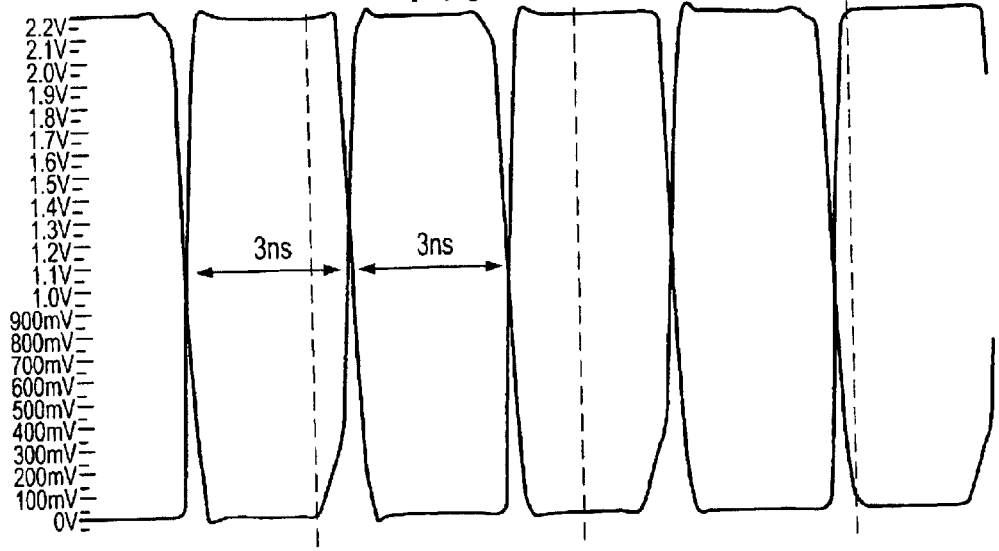
FIG. 13 is a graph of a simulated result of a differential output signal from the complete differential receiver depicted in FIG. 3 when stimulated with the mixed cross point input waveform depicted in FIG. 12.

FIG. 12 depicts a mixed low cross point and high cross point waveform as might result from a common mode bias coupling into the differential inputs or from supply noise. FIG. 13 is a plot of a simulation result of the output signals from the complete differential receiver 300 into the eleventh and twelfth inverter loads GI11 and GI12 when the differential signals depicted in FIG. 12 are provided at the inputs into the complete differential receiver 300. The mixed cross point waveform passes through the complete differential receiver 300 with a delay between 0.56 and 0.59 nanoseconds from the input cross point to the output cross point. The output signals resulting from the simulation reveal restored cross points in the more centered output. This effectively rejects distortions caused by common mode biases and supply noise.

This simple circuit gives reasonable performance when compared to using a differential pair based amplifier that has a constant current source and varying propagation delay.

Figure 14:
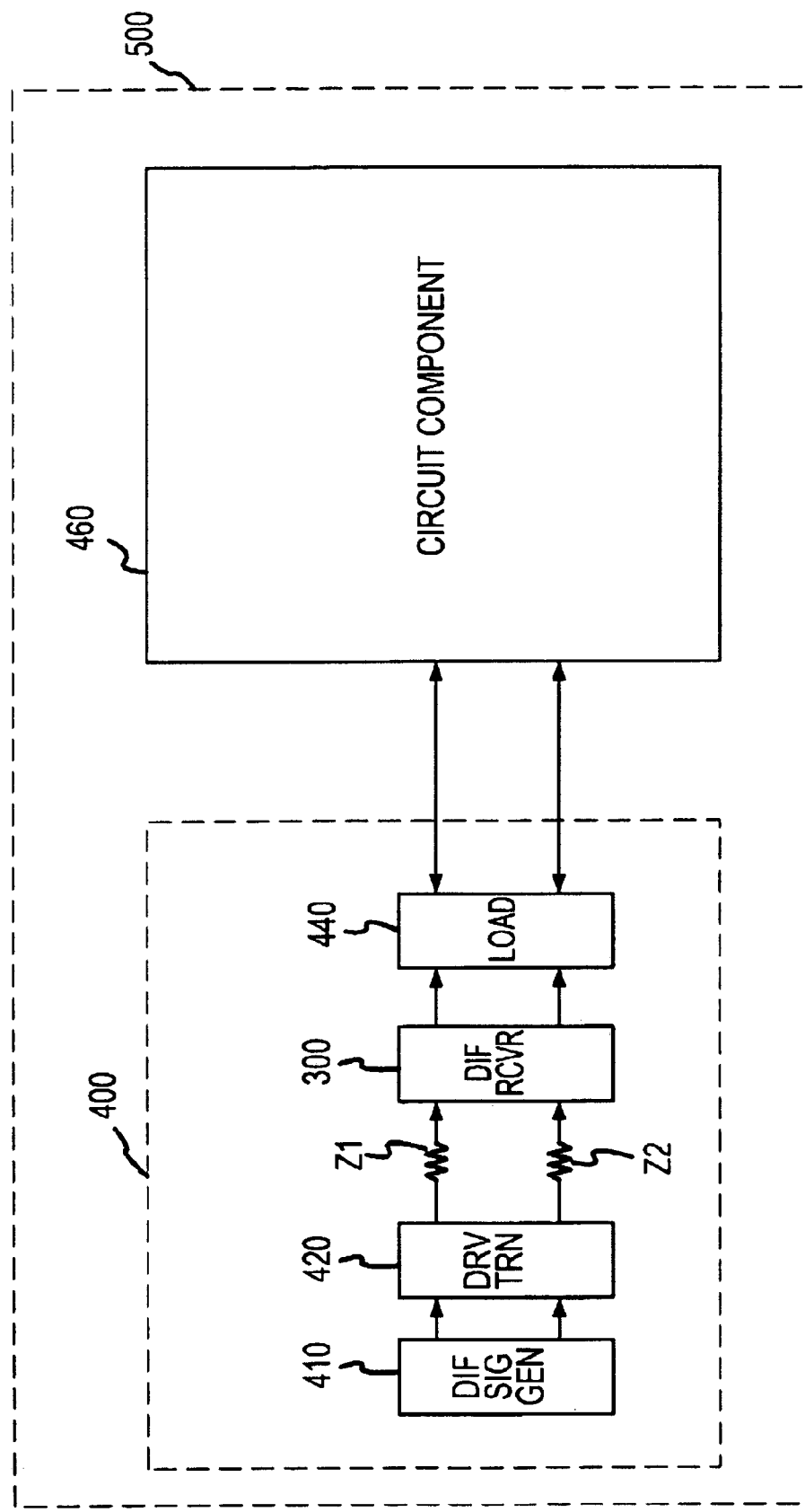
FIG. 14 is a schematic block diagram of an integrated circuit and system incorporating the complete differential receiver of FIG. 3 according to another example of the invention.

FIG. 14 depicts a system 500 that includes a semiconductor integrated circuit on a chip 400 (e.g., a memory device), and at least one more circuit component 460 that are not part of the integrated circuit 400. Integrated circuit 400 includes a differential signal generator 410 to generate true and complimentary signals INPUT and INPUT* (as discussed above with respect to FIG. 3), drive chain 420 (e.g., drive train 320, FIG. 3 or equivalent), parasitics Z1, Z2, the complete differential receiver 300, and loads 440 that may be similar to the loads 320 (FIG. 3) but ordinarily includes additional circuitry. For example, the loads 440 may includes the inverters GI11, GI12 of the loads 320 and additionally include control circuitry to control data movement in a large scale semiconductor integrated circuit such as a central processing unit (CPU) or a modern dynamic random access memory chip called DRAM.

The differential signal generator 410 may include just a buffer to receive a single ended or differential clock or strobe from outside the integrated circuit 400 and convert the clock or strobe to a differential signal before being amplified in drive chain 420. Alternatively, the differential signal generator may include logic circuits that generate the differential signal from a logical combination of signals received from outside of or inside of the integrated circuit 400.

The at least one more circuit component 460 that are not part of the integrated circuit 400 might be a CPU chip where the integrated circuit 400 is a memory device. Alternatively, the at least one more circuit component 460 that are not part of the integrated circuit 400 might be a memory device where the integrated circuit 400 is a CPU chip. In either event, system 500 includes two or more separate integrated circuit chips. These separate integrated circuits might be mounted on the same or a different printed wiring assembly before being installed into a mother board of an apparatus, or these separate integrated circuits might be mounted in any way in the same or a different apparatus and connected together by cables as in the case of a desktop computer being cable connected to a printer apparatus.

In a memory device or any other integrated circuit, or in a system on which such an integrated circuit is mounted on separate printed wiring assemblies or in separate apparatuses, the advantages over the prior art of low standby power, unvarying pulse duty cycle and repeatable propagation delays are bestowed on the integrated circuit 400 and the system 500.

Having described preferred embodiments of a novel constant delay zero standby differential logic receiver (which are intended to be illustrative and not limiting) with the details and particularity required by the patent laws, it is noted that modifications and variations can be made by persons skilled in the art in light of the above teachings. It is therefore to be understood that changes may be made in the particular embodiments of the invention disclosed which are within the scope and spirit of the invention as defined by the appended claims. Therefore, what is claimed and desired protected by Letters Patent is set forth in the appended claims.

What is claimed is:

1. A receiver circuit comprising:
a first pass circuit having a control input coupled to a first output of a differential transmission line and a signal input coupled to a second output of the differential transmission line, an output of the first pass circuit providing a first output signal;
a second pass circuit having a control input coupled to the second output of the differential transmission line and a signal input coupled to the first output of the differential transmission line, an output of the second pass circuit providing a second output signal;
a first inverter that is coupled between the first output of the differential transmission line and the control input of the first pass circuit;
a second inverter that is coupled between the second output of the differential transmission line and the signal input of the first pass circuit;
a third inverter having an input coupled to the first output signal, the third inverter having an output coupled to the second output signal; and
a fourth inverter having an input coupled to the second output signal, the fourth inverter having an output coupled to the first output signal.

2. The receiver circuit of claim 1, wherein:
the first pass circuit includes a first p channel transistor having a drain, a source and a gate electrode;
the first pass circuit further includes a first n channel transistor having a drain, a source and a gate electrode;
the control input of the first pass circuit includes the gate electrode of the first p channel transistor and the gate electrode of the first n channel transistor;
the signal input of the first pass circuit includes the source of the first p channel transistor and the source of the first n channel transistor;
the output of the first pass circuit includes the drain of the first p channel transistor and the drain of the first n channel transistor;
the second pass circuit includes a second p channel transistor having a drain, a source and a gate electrode;
the second pass circuit further includes a second n channel transistor having a drain, a source and a gate electrode;
the control input of the second pass circuit includes the gate electrode of the second p channel transistor and the gate electrode of the second n channel transistor;
the signal input of the second pass circuit includes the source of the second p channel transistor and the source of the second n channel transistor; and
the output of the second pass circuit includes the drain of the second p channel transistor and the drain of the second n channel transistor.

3. The receiver circuit of claim 1, further comprising:
a fifth inverter having an input coupled to the first output signal; and
a sixth inverter having an input coupled to the second output signal.

4. The receiver circuit of claim 1, wherein:
the first pass circuit includes a p channel transistor having a drain, a source and a gate electrode;
the first pass circuit further includes an n channel transistor having a drain, a source and a gate electrode;
the control input of the first pass circuit includes the gate electrode of the p channel transistor and the gate electrode of the n channel transistor;
the signal input of the first pass circuit includes the source of the p channel transistor and the source of the n channel transistor; and
the output of the first pass circuit includes the drain of the p channel transistor and the drain of the n channel transistor.

5. An integrated circuit comprising:
a differential transmission line on a chip, the differential transmission line having first and second outputs and being characterized by a low band pass;
a differential receiver on the chip, the differential receiver comprising:
a first pass circuit having a control input coupled to the first output of the differential transmission line and a signal input coupled to the second output of the differential transmission line, an output of the first pass circuit providing a first output signal;
a second pass circuit having a control input coupled to the second output of the differential transmission line and a signal input coupled to the first output of the differential transmission line, an output of the second pass circuit providing a second output signal;
a first inverter that is coupled between the first output of the differential transmission line and the control input of the first pass circuit;
a second inverter that is coupled between the second output of the differential transmission line and the signal input of the first pass circuit;

a third inverter having an input coupled to the first output signal, the third inverter having an output coupled to the second output signal; and a fourth inverter having an input coupled to the second output signal, the fourth inverter having an output coupled to the first output signal.

6. The integrated circuit of claim 5, wherein:

the first pass circuit includes a first p channel transistor having a drain, a source and a gate electrode;

the first pass circuit further includes a first n channel transistor having a drain, a source and a gate electrode;

the control input of the first pass circuit includes the gate electrode of the first p channel transistor and the gate electrode of the first n channel transistor;

the signal input of the first pass circuit includes the source of the first p channel transistor and the source of the first n channel transistor;

the output of the first pass circuit includes the drain of the first p channel transistor and the drain of the first n channel transistor;

the second pass circuit includes a second p channel transistor having a drain, a source and a gate electrode;

the second pass circuit further includes a second n channel transistor having a drain, a source and a gate electrode;

the control input of the second pass circuit includes the gate electrode of the second p channel transistor and the gate electrode of the second n channel transistor;

the signal input of the second pass circuit includes the source of the second p channel transistor and the source of the second n channel transistor; and the output of the second pass circuit includes the drain of the second p channel transistor and the drain of the second ii channel transistor.

7. The integrated circuit of claim 5, further comprising:

a fifth inverter having an input coupled to the first output signal; and a sixth inverter having an input coupled to the second output signal.

8. The integrated circuit of claim 5, wherein:

the first pass circuit includes a p channel transistor having a drain, a source and a gate electrode;

the first pass circuit further includes an n channel transistor having a drain, a source and a gate electrode;

the control input of the first pass circuit includes the gate electrode of the p channel transistor and the gate electrode of the n channel transistor;

the signal input of the first pass circuit includes the source of the p channel transistor and the source of the n channel transistor; and the output of the first pass circuit includes the drain of the p channel transistor and the drain of the n channel transistor.

9. A memory device comprising:

a differential signal generator;

a differential transmission line on a chip coupled to the differential signal generator, the differential transmission line having first and second outputs and being characterized by a low band pass;

a differential receiver on the chip, the differential receiver comprising:

a first pass circuit having a control input coupled to the first output of the differential transmission line and a signal input coupled to the second output of the differential transmission line, an output of the first pass circuit providing a first output signal;

a second pass circuit having a control input coupled to the second output of the differential transmission line and a signal input coupled to the first output of the differential transmission line, an output of the second pass circuit providing a second output signal;

a first inverter that is coupled between the first output of the differential transmission line and the control input of the first pass circuit;

a second inverter that is coupled between the second output of the differential transmission line and the signal input of the first pass circuit;

a third inverter having an input coupled to the first output signal, the third inverter having an output coupled to the second output signal; and a fourth inverter having an input coupled to the second output signal, the fourth inverter having an output coupled to the first output signal; and a logic circuit on the chip having an input coupled to the first output signal.

10. The memory device of claim 9, wherein:

the first pass circuit includes a first p channel transistor having a drain, a source and a gate electrode;

the first pass circuit further includes a first n channel transistor having a drain, a source and a gate electrode;

the control input of the first pass circuit includes the gate electrode of the first p channel transistor and the gate electrode of the first n channel transistor;

the signal input of the first pass circuit includes the source of the first p channel transistor and the source of the first n channel transistor;

the output of the first pass circuit includes the drain of the first p channel transistor and the drain of the first n channel transistor;

the second pass circuit includes a second p channel transistor having a drain, a source and a gate electrode;

the second pass circuit further includes a second n channel transistor having a drain, a source and a gate electrode;

the control input of the second pass circuit includes the gate electrode of the second p channel transistor and the gate electrode of the second n channel transistor;

the signal input of the second pass circuit includes the source of the second p channel transistor and the source of the second n channel transistor; and the output of the second pass circuit includes the drain of the second p channel transistor and the drain of the second n channel transistor.

11. The memory device of claim 9, further comprising:

a fifth inverter having an input coupled to the first output signal; and a sixth inverter having an input coupled to the second output signal.

12. The memory device of claim 9, wherein:

the first pass circuit includes a p channel transistor having a drain, a source and a gate electrode;

the first pass circuit further includes an n channel transistor having a drain, a source and a gate electrode;

the control input of the first pass circuit includes the gate electrode of the p channel transistor and the gate electrode of the n channel transistor;

the signal input of the first pass circuit includes the source of the p channel transistor and the source of the n channel transistor; and the output of the first pass circuit includes the drain of the p channel transistor and the drain of the n channel transistor.

13. As system comprising an integrated circuit and at least one other circuit, wherein the integrated circuit includes:
   a differential signal generator;
   a differential transmission line on a chip coupled to the differential signal generator, the differential transmission line having first and second outputs and being characterized by a low band pass, the at least one other circuit being a circuit unimplemented on the chip;
   a differential receiver on the chip, the differential receiver comprising:
      a first pass circuit having a control input coupled to the first output of the differential transmission line and a signal input coupled to the second output of the differential transmission line, an output of the first pass circuit providing a first output signal;
      a second pass circuit having a control input coupled to the second output of the differential transmission line and a signal input coupled to the first output of the differential transmission line, an output of the second pass circuit providing a second output signal;
      a first inverter that is coupled between the first output of the differential transmission line and the control input of the first pass circuit;
      a second inverter that is coupled between the second output of the differential transmission line and the signal input of the first pass circuit;
      a third inverter having an input coupled to the first output signal, the third inverter having an output coupled to the second output signal; and
      a fourth inverter having an input coupled to the second output signal, the fourth inverter having an output coupled to the first output signal; and
   a logic circuit on the chip having an input coupled to the first output signal.

14. The memory device of claim 13, wherein:
   the first pass circuit includes a first p channel transistor having a drain, a source and a gate electrode;
   the first pass circuit further includes a first n channel transistor having a drain, a source and a gate electrode;
   the control input of the first pass circuit includes the gate electrode of the first p channel transistor and the gate electrode of the first n channel transistor;
   the signal input of the first pass circuit includes the source of the first p channel transistor and the source of the first n channel transistor;
   the output of the first pass circuit includes the drain of the first p channel transistor and the drain of the first n channel transistor;
   the second pass circuit includes a second p channel transistor having a drain, a source and a gate electrode;
   the second pass circuit further includes a second n channel transistor having a drain, a source and a gate electrode;
   the control input of the second pass circuit includes the gate electrode of the second p channel transistor and the gate electrode of the second n channel transistor;
   the signal input of the second pass circuit includes the source of the second p channel transistor and the source of the second n channel transistor; and
   the output of the second pass circuit includes the drain of the second p channel transistor and the drain of the second n channel transistor.

15. The memory device of claim 13, further comprising:
   a fifth inverter having an input coupled to the first output signal; and
   a sixth inverter having an input coupled to the second output signal.

16. The memory device of claim 13, wherein:
   the first pass circuit includes a p channel transistor having a drain, a source and a gate electrode;
   the first pass circuit further includes an n channel transistor having a drain, a source and a gate electrode;
   the control input of the first pass circuit includes the gate electrode of the p channel transistor and the gate electrode of the n channel transistor;
   the signal input of the first pass circuit includes the source of the p channel transistor and the source of the n channel transistor; and
   the output of the first pass circuit includes the drain of the p channel transistor and the drain of the n channel transistor.

* * * * *

UNITED STATES PATENT AND TRADEMARK OFFICE
CERTIFICATE OF CORRECTION

PATENT NO. : 6,920,187 B2
APPLICATION NO. : 10/264008
DATED : July 19, 2005
INVENTOR(S) : Daniel B. Penney It is certified that error appears in the above-identified patent and that said Letters Patent is hereby corrected as shown below:

| Column, Line | Reads | Should Read |
|---|---|---|
| Item (57), Title Page abstract Lines 8 and 10 | "complimentary" | --complementary-- |
| Column 1, Line 36 | "early, may" | --early may-- |
| Column 1, Line 37 | "data lines may not" | --data lines may not-- |
| Column 1, Line 58 | "its compliment," | --its complement,-- |
| Column 1, Line 60 | "that constitute" | --that constitutes-- |
| Column 2, Lines 50-52, 55 and 56-57 | "complimentary" | --complementary-- |
| Column 3, Lines 47, 48, and 53 | "complimentary" | --complementary-- |
| Column 4, Lines 20 and 22 | "complimentary" | --complementary-- |
| Column 4, Line 36 | "be non inverting" | --be non-inverting-- |
| Column 5, Lines 7 and 8 | "complimentary" | --complementary-- |
| Column 5, Line 14 | "to over drive" | --to over-drive-- |
| Column 5, Line 28 | "teachings In the" | --teachings.  In the-- |
| Column 5, Line 30 | "transistors MNI1, MN2" | --transistors MN1, MN2-- |
| Column 5, Line 46 | "can be over powered" | --can be over-powered-- |
| Column 6, Lines 5, 13 and 14 | "complimentary" | --complementary-- |

UNITED STATES PATENT AND TRADEMARK OFFICE
CERTIFICATE OF CORRECTION

PATENT NO. : 6,920,187 B2
APPLICATION NO. : 10/264008
DATED : July 19, 2005
INVENTOR(S) : Daniel B. Penney It is certified that error appears in the above-identified patent and that said Letters Patent is hereby corrected as shown below:

| Column, Line | Reads | Should Read |
| --- | --- | --- |
| Column 6, Line 39 | "Although, the parasitic" | --Although the parasitic-- |
| Column 7, Lines 2 and 45 | "complimentary" | --complementary-- |
| Column 7, Line 5 | "that is inputs to" | --that is the input to-- |
| Column 8, Line 55 | "complimentary" | --complementary-- |
| Column 9, Lines 7 and 10 | "that are not" | --that is not-- |
| Column 11, Line 35 | "second ii channel transistor." | --second n channel transistor.-- |
| Column 13, Line 4 | "As system" | --A system-- |

Signed and Sealed this

Twenty-seventh Day of March, 2007

JON W. DUDAS
*Director of the United States Patent and Trademark Office*